United States Patent [19]

Nulman et al.

[11] Patent Number: 4,496,419
[45] Date of Patent: Jan. 29, 1985

[54] FINE LINE PATTERNING METHOD FOR SUBMICRON DEVICES

[75] Inventors: Jaime Nulman, Cali, Colombia; J. Peter Krusius, Helsinki, Finland

[73] Assignee: Cornell Research Foundation, Inc., Ithaca, N.Y.

[21] Appl. No.: 529,661

[22] Filed: Sep. 6, 1983

Related U.S. Application Data

[63] Continuation of Ser. No. 470,808, Feb. 28, 1983.

[51] Int. Cl.³ .......................... C23F 1/02; B44C 1/22; C03C 15/00; C03C 25/06
[52] U.S. Cl. .................... 156/643; 156/646; 156/652; 156/656; 156/659.1; 204/192 E; 430/313; 430/318
[58] Field of Search ............... 156/643, 646, 653, 652, 156/656, 659.1, 661.1, 904; 252/79.1; 204/192 E, 164, 298; 430/312, 313, 316, 318; 427/38, 39, 43.1, 282, 399

[56] References Cited

U.S. PATENT DOCUMENTS

| | | | |
|---|---|---|---|
| 3,737,341 | 6/1973 | Croset et al. | 156/659.1 X |
| 3,738,880 | 6/1973 | Laker | 148/187 X |
| 3,799,777 | 3/1974 | O'Keefe et al. | 156/656 X |
| 3,801,366 | 4/1974 | Lemelson | 427/53.1 X |
| 3,833,434 | 9/1974 | Kikuchi et al. | 252/79.2 X |
| 3,867,148 | 2/1975 | O'Keefe et al. | 156/656 X |
| 3,941,630 | 3/1976 | Larrabee | 204/38 A X |
| 4,035,206 | 7/1977 | Rioult et al. | 156/628 |
| 4,092,210 | 5/1978 | Hoepfner | 156/643 |
| 4,093,503 | 6/1978 | Harris et al. | 156/628 |
| 4,139,386 | 2/1979 | Stewart | 156/655 X |
| 4,144,118 | 3/1979 | Stahl | 156/659.1 |
| 4,174,219 | 11/1979 | Andres et al. | 430/321 |
| 4,208,241 | 6/1980 | Harshbarger | 156/643 |
| 4,244,799 | 1/1981 | Fraser et al. | 204/192 E |
| 4,261,792 | 4/1981 | Tsuji et al. | 156/659.1 X |
| 4,267,013 | 5/1981 | Iida et al. | 156/643 |
| 4,314,874 | 2/1982 | Abe et al. | 156/656 X |

Primary Examiner—William A. Powell
Attorney, Agent, or Firm—Jones, Tullar & Cooper

[57] ABSTRACT

A technique for fine line patterning for submicron devices is disclosed. A fine line pattern is defined on a positive resist, which is then developed to expose corresponding portions of a mask layer. The pattern is then transferred to the mask layer to produce an oxidation mask which is used to control local surface oxidation of an underlying metal film, such as aluminum. The selectively oxidized aluminum film is then etched, leaving a patterned Al film corresponding to the initial positive pattern, since the etch rate of oxidized Al film is much less than the etch rate of the unoxidized Al film. The patterned film may be the final desired device structure, or may serve as a mask for pattern transfer to an underlying substrate.

18 Claims, 13 Drawing Figures

COMPOSITE FILM PATTERN

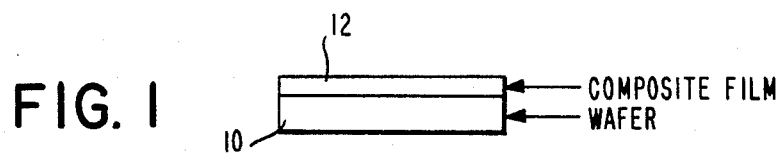
FIG. 1 — COMPOSITE FILM / WAFER
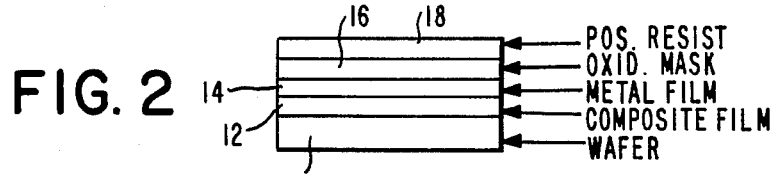
FIG. 2 — POS. RESIST / OXID. MASK / METAL FILM / COMPOSITE FILM / WAFER
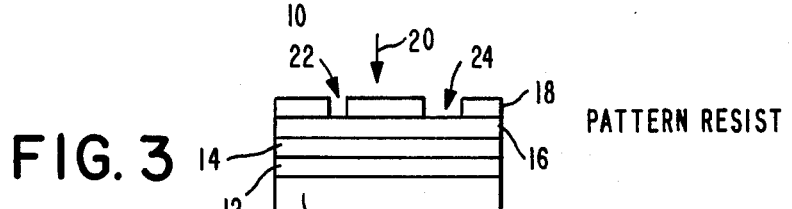
FIG. 3 — PATTERN RESIST
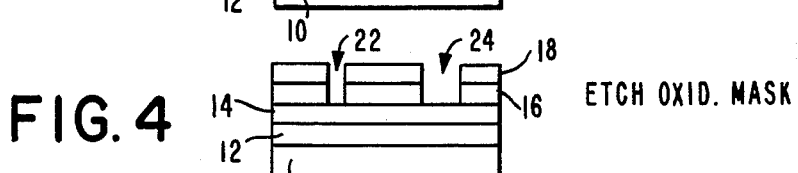
FIG. 4 — ETCH OXID. MASK
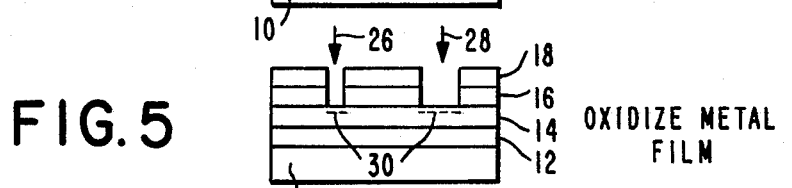
FIG. 5 — OXIDIZE METAL FILM
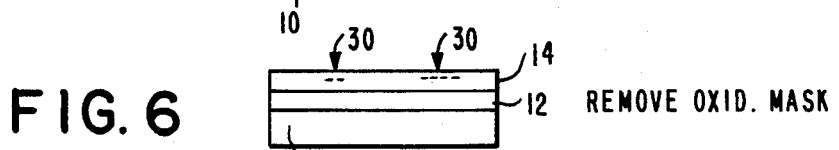
FIG. 6 — REMOVE OXID. MASK
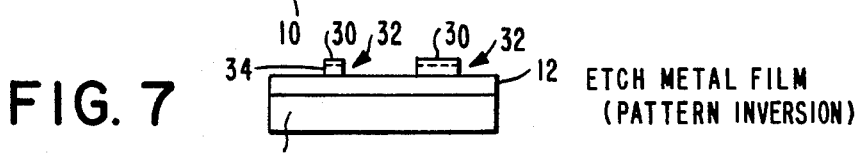
FIG. 7 — ETCH METAL FILM (PATTERN INVERSION)
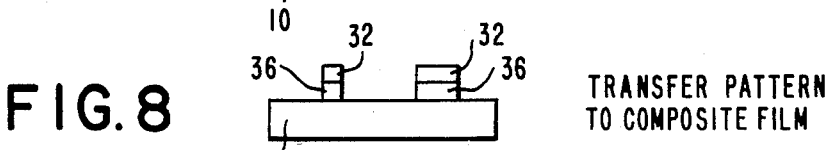
FIG. 8 — TRANSFER PATTERN TO COMPOSITE FILM
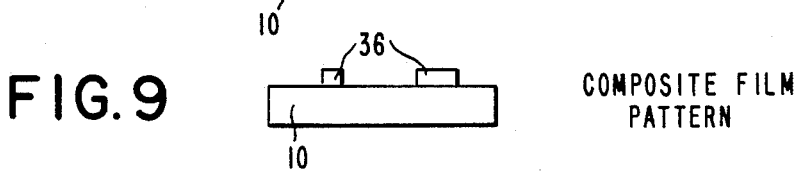
FIG. 9 — COMPOSITE FILM PATTERN

FINE LINE PATTERNING METHOD FOR SUBMICRON DEVICES

This invention relates to work supported by Grant No. ECS-820031 of the National Science Foundation.

This application is a continuation of application Ser. No. 470,808, filed Feb. 28, 1983.

BACKGROUND OF THE DISCLOSURE

The present invention relates, in general, to a new and unique method of fine line patterning, and more particularly to a technique based on the selective surface oxidation of aluminum for producing pattern lines in the range of 1500 Å in width for use in making submicron device structures or etching masks.

Pattern definition and pattern transfer are among the most important activities in the fabrication of semiconductor devices and integrated circuits. The production of micro-miniature electronic components requires the formation of very accurately dimensioned component patterns in layers on a substrate or in a semiconductor body. A standard production method is to irradiate portions of a radiation-sensitive layer overlaid on a component layer or body to define a pattern of differential solubility. The pattern definition typically involves the use of optical, X-ray or electron beam lithography, followed by development of the sensitive layer to remove either the radiated region, in the case of a positive resist material, for example, or the non-irradiated region, in the case of a negative resist material, for example, and in each case to leave the remainder of the sensitive layer to define the desired pattern. The pattern is then transferred to the underlying substrate by, for example, etching or deposition through the openings or windows defined in the radiation sensing layer.

Radiation sensitive materials with the high resolution capabilities required to obtain high accuracy in the fabrication of electronic components are available with positive sensitivity to allow the transfer of original patterns to substrates. But is is often important to be able to produce the negative of the original pattern in the substrate. This may be accomplished by means of a negative resist or by the liftoff of a deposited film, but for dimensions below one micrometer (1 $\mu$m), as required in the fabrication of micro-miniature devices, both of these latter processes have limitations. High resolution negative resists with sufficient sensitivity and with reproducable characteristics have not yet been developed, despite major research efforts, and the use of lift-off techniques to produce pattern inversion produces lines with triangularly-shaped cross-sections, a feature which is generally undesirable and is difficult to control precisely.

SUMMARY OF THE INVENTION

It is an object of the present invention to provide a novel method for obtaining pattern inversion and transfer in the fabrication of semiconductor devices and integrated circuits.

It is another object of the invention to provide a method for producing fine line patterns for use in fabricating submicron electronic components.

It is a further object of the present invention to produce fine line pattern inversion in the fabrication of submicron electronic components.

It is another object of the present invention to provide fine line patterns having essentially vertical walls for linewidths much smaller than one micrometer.

Still another object of the invention is the production of fine line patterns for submicron devices through the use of positive resist materials, whereby the limitations of negative resists and lift-off techniques are avoided.

Briefly, the present invention is directed to a fine line patterning method for use in the fabrication of submicron electronic devices such as semiconductors and integrated circuits. The method incorporated the steps of exposing and developing positive resists followed by local oxidation and reactive ion etching of a metal film. The film serves as a substitutional mask or serves as a metal pattern with a passivation layer in the final structure, and provides pattern inversion without the use of a negative resist material.

In accordance with the present method, pattern inversion and transfer for fine lines with linewidths well below 1 $\mu$m is realized through four basic steps. First, the initial pattern is defined in a positive resist using a conventional lithographic process, such as deep ultraviolet optical lithography, X-ray lithography, or electron beam lithography. Second, the pattern thus formed in the positive resist is transferred to an oxidation mask which lies on top of a metal film. This transfer is accomplished by a suitable anisotropic dry etching process such as plasma etching, reactive ion etching, or ion milling. Third, the metal film uncovered by the pattern transferred to the oxidation mask is then oxidized locally as by growing a thin metal oxide film using such methods as native oxide growth, anodic oxide growth, or plasma ion enhanced oxide growth. Fourth, the selectively oxidized metal film is etched to remove the metal not protected by surface oxide layer, thereby producing a metal pattern which serves either as a passivated metal structure or as an etch mask for a suitable dry etching process, such as plasma etching, reactive ion etching, or ion milling.

The locally oxidized metal produced by the oxidation process of step three carries the original positive pattern. Pattern inversion occurs in the fourth step and in the dry etching which follows production of the metal film pattern. This method thus overcomes the limitations of negative resists and liftoffs for making submicron lines, and metal lines as narrow as 1500 Å (0.15 $\mu$m) with vertical walls have been attained. Important applications of this method include the fabrication of semiconductor devices such as self-aligned submicron silicon metal-oxide-semiconductor field-effect transistors (MOSFETs) and GaAs metal-semiconductor field-effect transistors (MESFETs).

In a preferred form of the invention, a suitable substrate is coated, as by evaporation, by a thin film of aluminum, and a thin film of silicon is then applied to the aluminum. A multilayer positive electron resist system is coated onto the silicon film layer. The original pattern is applied to the top layer of the positive resist material, as by means of conventional direct electron beam writing using, for example, a Cambridge EBMF2-150 electron beam direct writer, produced by Cambridge Instruments, Ltd., Cambridge CB23QH, England. After developing the electron beam exposed lines in the top resist layer, pattern transfer procedures based on anisotropic reactive ion etching are used to uncover corresponding portions of the surface of the silicon film. The exposed Si film is then etched by reactive ion etching to expose those portions of the Al film which correspond to the pattern, the Si film then providing an oxidation mask for the subsequent oxidation of the surface of the exposed Al film. Oxidation is carried out by means of an $O_2$ plasma directed at the surface of the Al film, and the Si oxidation mask is then removed.

Oxidation of the Al film significantly reduces its etch rate, with the etch rate of unoxidized aluminum being in excess of four times the rate of plasma oxidized aluminum. This etch ratio is much greater than 4:1 and permits pattern inversion during the next step of the method of the present invention, wherein the selectively oxidized Al film is anisotropically etched by using reactive ion etching procedures to remove the non-oxidized Al film.

If the remaining Al film patterns is the final desired structure, as may be the case if the Al film is to form a device gate or an interconnect line, the process ends. If, on the other hand, the Al film is to serve as an etch mask for the underlying substrate, the pattern is transferred to that substrate by means of any suitable dry etching process, such as ion milling, plasma etching, or reactive ion etching. Thereafter, the Al mask can be removed in a wet chemical etch, since only the upper surface of the Al film has been oxidized. The substrate may be, for example, a composite silicide—refractory metal film of Mo-Ta-PtSi, with the process of the invention producing as a final patterned line a fine Mo-Ta-PtSi gate line of a self-aligned Si MESFET device.

BRIEF DESCRIPTION OF THE DRAWINGS

The foregoing and additional objects, features and advantages of the present invention will be more fully appreciated from the following more detailed description of a preferred embodiment thereof, taken in conjunction with the accompanying drawings, in which:

FIGS. 1–9 provide a diagrammatic illustration of the method steps for the patterning technique of the present invention;

DESCRIPTION OF PREFERRED EMBODIMENT

Figure 10A:
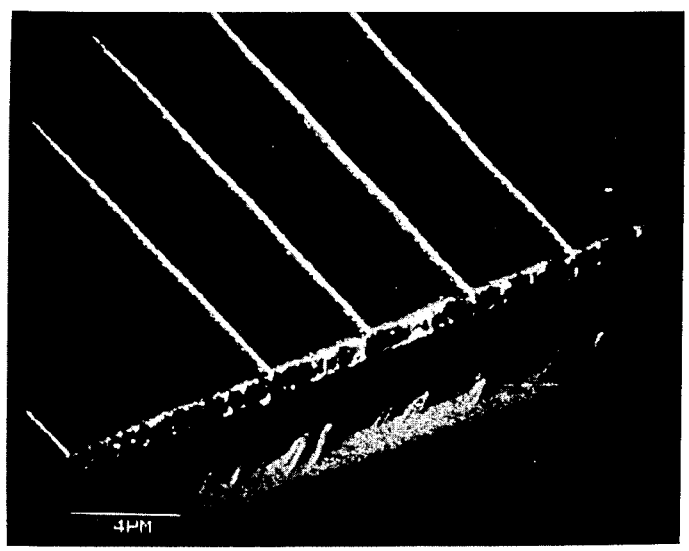
FIGS. 10a and 10b represent scanning electron microscope views of the aluminum fine lines of FIG. 7.

Turning now to a more detailed description of the present invention, reference is made to FIGS. 1–9 which illustrate a sequence of steps which are followed in producing submicron patterns in accordance with the inventive process. These steps permit fine line patterning based on local surface oxidation and anisotropic dry etching of a metal film, wherein the film acts either as a device structure such as a gate or interconnect, or as pattern-inverting mask for etching underlying layers. Although the method of the invention may be used with a variety of materials, for convenience and clarity it will be hereinafter described in terms of a specific example, wherein the metal film is aluminum and wherein the process steps are consistent with the use of such a film. The described steps are, therefore, set forth in terms specific to such a preferred embodiment, although it will be understood that variations and modifications in the described materials and process parameters may be made without departing from the inventive concept.

In the process illustrated by FIGS. 1–9, a wafer 10 is shown as the supporting material for a substrate 12 in which a fine line pattern is to be produced. The substrate may be any suitable material for submicron devices such as field effect transistors, integrated circuits, and the like. Thus, for example, the substrate 12 may be a composite silicide-refractory metal film consisting of a bottom layer of PtSi about 400 Å thick, a middle layer of Ta about 800 Å thick, and a top layer of Mo about 4000 Å thick.

The substrate 12 is covered by a thin metal film 14 (FIG. 2) which, in the preferred form of the invention, and for purposes of the following description is a film of aluminum about 2000 Å thick. The Al layer 14 is deposited by electron gun evaporation, for example at $8 \times 10^{-5}$ Torr at a rate of 10 Å per second.

Under the same vacuum, a film 16 of about 300 Å of silicon is next deposited on the metal film layer 14, again using electron gun evaporation. By depositing the film under the same vacuum as the Al film, the formation of native oxide on the Al layer is avoided. This Si film 16 serves as an oxidation mask for the Al film, as will be shown.

A three-layer positive, high resolution resist material 18 is next deposited on the surface of the layer 16, the resist consisting of a bottom layer of polymethylmethacrylate (PMMA) about 10,000 Å thick, a 400 Å thick middle layer of germanium, and a top layer 1500 Å thick of PMMA. This completes the coating of the wafer, preparatory to patterning.

As illustrated in FIG. 3, an original pattern is written into the resist system using, for example, direct electron beam writing, indicated by arrow 20. This initial definition of the pattern may alternatively use optical, electron beam, ion beam or X-ray lithography. After developing the exposed pattern lines in the top PMMA layer of positive resist 18 to remove the exposed region, standard pattern transfer procedures for multi-layer resist materials are followed until the surface of the Si film layer 16 is reached. The preferred transfer procedure utilizes reactive ion etching (RIE) of the Ge and bottom PMMA layers of the resist material.

The exposed top layer of PMMA may be developed for 1.5 min., for example, and the Ge layer may be etched using RIE with $CHF_3$ in a chamber at a pressure 10 mTorr, at a flow rate of 20 sccm, and at an rf power level of 0.2 W/cm$^2$. The bottom layer of PMMA may then be etched using RIE with $O_2$ in 60 mTorr, at 20 sccm, and at 0.3 W/cm$^2$, thereby producing the resist pattern indicated at 22 and 24 of FIG. 3, and exposing selected portions of the surface of the oxidizing mask layer 16.

The exposed portions of the Si film layer 16 are next etched in a $CF_4$ reactive ion etching step operated, for example, at 0.2 W/cm$^2$, 10 mTorr and 10 sccm of $CF_4$, to transfer the pattern of layer 18 to film 16, as illustrated in FIG. 4. Thus, pattern 22, 24 is extended into and through layer 16, to expose portions of the upper surface of the metal film 14. The Si layer 16 is readily patterned by $CF_4$ RIE, as is known in the art.

The reactive ion etching of the resist and oxidation mask layers 18 and 16, respectively, as described above is essentially anisotropic; i.e., is essentially directional, producing essentially flat, vertical etch walls on planes passing approximately through the initial resist patter edges prior to etching. Thus, the width of the pattern lines of the oxidation mask formed in the Si layer 16 is essentially identical to that of the initial pattern, substantially without undercutting or triangulation.

The exposed portions of the metal film layer 14, which in this example is aluminum, are locally oxidized by an $O_2$ plasma where not protected by the oxidation mask 16, the plasma being indicated diagrammatically by the arrows 26 and 28 in FIG. 5. The plasma produces surface layers of aluminum oxide (mainly $Al_2O_3$) on the exposed surface portions of film 14, as indicated at 30. The oxidizing plasma is supplied while the coated wafer is heated to, for example, 150° C. at about 0.5 W/cm$^2$. This $O_2$ plasma simultaneously removes the overlying resist layer 18.

As illustrated in FIG. 6, the next step in the process of the present invention is the removal of the oxidation mask 16. This may be accomplished by reactive ion etching using a $Cl_2$ plasma. RIE for removal of an Si film is taught by G. C. Schwartz and P. M. Schaible, "Proceedings of the Symposium on Plasma Etching and Deposition", May 1980, p. 133. This leaves the pattern oxidized metal film 14, with the oxidized pattern 30 corresponding to the pattern which was written into the resist layer 18 in the process step explained with respect to FIG. 3.

The next step of the process, as illustrated in FIG. 7, is the etching of the metal film 14. This is accomplished by anisotropic etching of film 14, using, for Al film, $SiCl_4$ reactive ion etching at 0.15 W/cm$^2$, 60 mTorr, and 30 sccm. This dry etching step produces pattern inversion and results in a negative pattern mask 32 because of the large etch ratio between plasma oxidized and nonoxidized aluminum, as will be explained below. Aluminum RIE using $SiCl_4$ may be carried out by means of a commercially available system such as the Plasma-Therm Reactive Ion Etching System PK 1250, available from Plasma-Therm Systems, Inc., Kresson, New Jersey, 08053. Typical parameters for aluminum etching with such a system include an rf power level of 0.16 W/cm$^2$, an etching flow rate of 30 sccm, and a chamber pressure of 60 mTorr.

Ion milling of aluminum films has previously been used in dry etching processes for the production of etch masks; however the milling rate is quite low. The formation of $Al_2O_3$ by the oxygen background atmosphere (typically $8 \times 10^{-5}$ Torr) reduces the milling rate to a level much lower than that of pure aluminum. Reactive ion etching, on the other hand, has much higher etch rates, and much better selectivity than ion milling. Thus, a nonoxidized aluminum film has an RIE rate of about 3000 Å/min, while an oxidized aluminum film has an RIE rate of less than 700 Å/min, corresponding to an etch ratio larger than 4:1. It was found, for example, that Al films oxidized in $O_2$ plasma at about 0.5 W/cm$^2$ for 20 min, with the substrate heated to 150° C., did not show any mechanically detectable etching in RIE runs under the conditions described above with respect to the etching of film 14 (FIG. 7). This large etching ratio permits fabrication of the metal film pattern mask 32, although it will be understood that the thickness of the surface oxide 30 with respect to the thickness of the rest of the Al film 14 must be compatible with the associated RIE etch ratio to achieve complete pattern formation.

If the film pattern 32 is the final desired structure, as may be the case in the fabrication of a semiconductor device gate or an interconnect line for integrated circuits, the process ends with the device of FIG. 7. The resultant inverted pattern then consists of fine lines 32 of surface-oxidized metal. Electrical contacts through the surface oxide on the metal film can be made by conventional photolithography and ion milling. Further, the sidewalls 34 of the lines 32 can also be oxidized in an $O_2$ plasma.

If the process is not stopped at the device of FIG. 7, the next step is to use the pattern lines 32 as an etch mask for the underlying material of layer 12, as shown in FIG. 8, to transfer the negative (or inverted) pattern to form the fine lines 36 in layer 12. This may be accomplished in the Mo-Ta-PtSi layer 12 by means of a $CF_4+O_2$ RIE step followed by ion milling using Ar+20% $O_2$. Finally, the Al mask may be removed in a wet chemical etch (See FIG. 9), leaving the fine lines 36 in a pattern which is the inverse of the initial pattern written in FIG. 3. Such a wet chemical etch will easily remove the Al mask, since only the surface layer 30 has been converted to $Al_2O_3$.

Figure 10B:
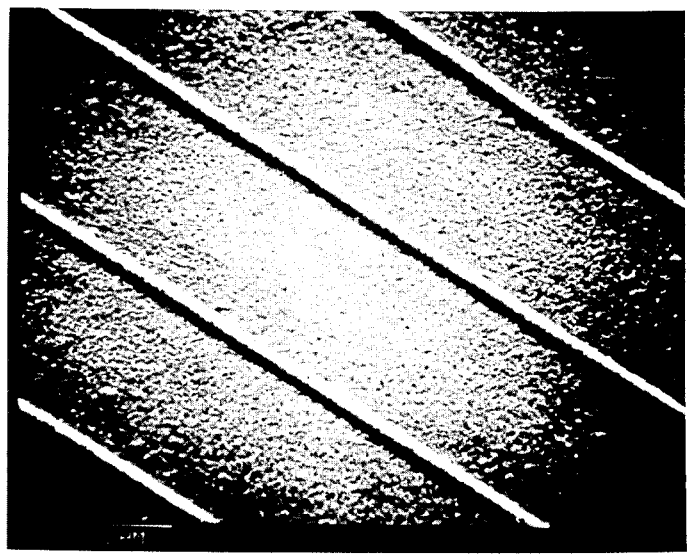
Figure 11A:
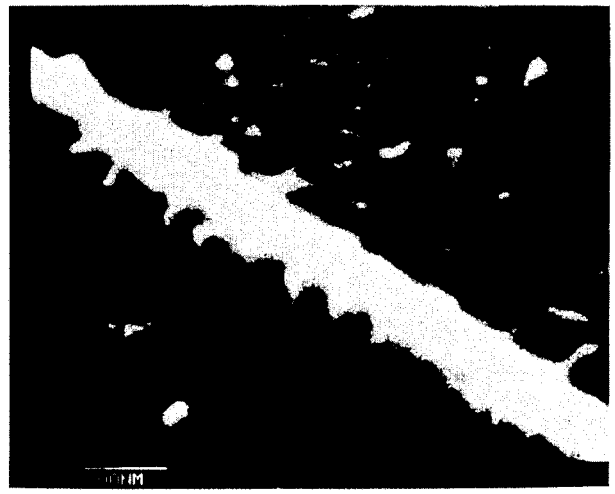
FIGS. 11a and 11b represent enlarged views of the lines of FIG. 10b.
Figure 11B:

In a test of the foregoing process using the described parameters, final pattern lines 36 consisting of a 5000 Å wide Mo-Ta-PtSi gate line of a self-aligned Si MESFET device structure were produced. Lines as fine as 1500 Å have also been produced by the process described herein, and scanning electron microscope views of 1500 Å and 5000 Å wide Al lines 32 produced in the metal film layer 14 are illustrated in FIGS. 10a and 10b, respectively. FIGS. 11a and 11b are enlarged views of the lines of FIG. 10b. It is anticipated that the present invention will permit patterning of self-aligned gate lines for silicon and GaAs semiconductor devices with dimensions less than 1500 Å, with the practical limits being the resolution of the lithography system.

In summary, a novel fine line patterning technique based on local surface oxidation and dry etching of aluminum has been disclosed, wherein many of the problems of using negative resists or lift-off processes to obtain pattern inversion in submicron devices have been overcome. Although other metal films may be used in the described process, aluminum is preferred. Further, although specific parameters for the process steps have been described, such parameters may be varied in accordance with conventional practice without departing from the invention. Thus, for example, reactive ion etching of aluminum may be accomplished not only with $SiCl_4$, but with other etchants such as $Cl_4$, $Cl_2$, and $BCl_2$. Accordingly, it is intended that the true spirit and scope of the present invention be limited only by the following claims.

What is claimed is:

1. A process for fine line patterning for submicron devices, comprising:
   defining a fine line pattern in a positive resist;
   transferring the fine line pattern to an underlying oxidation mask material to define therein a positive oxidation mask and to expose corresponding portions of the surface of a metal film underlying said oxidation mask layer;
   oxidizing the exposed surface portions of said metal film through said oxidation mask to transfer said fine line pattern to said metal film;
   removing said oxidation mask; and
   etching said metal film to selectively remove unoxidized portions of said metal film, thereby producing an inverted metal film pattern.

2. The method of claim 1, wherein said metal film is aluminum.

3. The method of claim 2, wherein the step of etching said metal film comprises reactive ion etching.

4. The method of claim 3, wherein the step of removing said oxidation mask comprises reactive ion etching of said mask layer.

5. The method of claim 2, further including oxidizing the side walls of said inverted metal film pattern.

6. The method of claim 1, further including transferring said metal film pattern to an underlying substrate, said metal film pattern serving as a transfer mask.

7. The method of claim 6, further including removing said metal film pattern from said substrate after transfer of said pattern, thereby producing an inverted pattern substrate.

8. The method of claim 1, wherein the step of etching said metal film comprises reactive ion etching.

9. The method of claim 8, wherein the step of removing said oxidation mask comprises reactive ion etching of said mask layer.

10. The method of claim 9, further including transferring said metal film pattern to an underlying substrate, said metal film pattern serving as a transfer mask.

11. The method of claim 10, wherein the step of transferring said metal film pattern to said underlying substrate comprises dry anisotropic etching of said substrate.

12. The method of claim 11, further including removing said metal film pattern from said substrate after transfer of said pattern.

13. A process for fabricating negative patterns in submicron devices through pattern inversion, comprising:
providing a wafer having in successive layers a substrate, a thin aluminum film, an oxidation mask layer, and a positive resist;
defining a positive pattern in said positive resist layer;
developing said resist to expose portions of the surface of the underlying oxidation mask layer corresponding to said pattern;
transferring said pattern to said oxidation mask layer through anisotropic etching of said oxidation mask layer to produce an oxidation mask and to expose through said mask portions of the surface of the underlying aluminum film corresponding to said pattern;
oxidizing the exposed surface portions of said aluminum film to produce on the surface of said aluminum film a pattern of oxidation corresponding to said positive pattern;
removing said oxidation mask from the surface of said aluminum film; and
patterning said aluminum film through anisotropic etching of said film, the etching of the unoxidized portion of said film being at a rate greater than the etching rate of said oxidized portion to thereby produce pattern inversion.

14. The process of claim 13, further including transferring the inverted pattern of said aluminum film to said substrate and thereafter removing said aluminum film from said substrate.

15. The process of claim 14, wherein the etching of said aluminum film is by reactive ion etching, whereby said unoxidized aluminum is etched at a rate that is more than four times the rate at which said oxidized aluminum is etched.

16. The process of claim 13, wherein the steps of transferring said positive pattern to said oxidation mask layer, removing said oxidation mask from the surface of said aluminum film, and patterning said aluminum film are all dry etching steps.

17. The process of claim 16, wherein the step of oxidizing the exposed surface portions of said aluminum film comprises plasma oxidation.

18. The process of claim 17, further including transferring by dry etching the inverted pattern of said aluminum film to said substrate and thereafter removing said aluminum film from said substrate.

* * * * *